United States Patent [19]

Matsumoto et al.

[11] Patent Number: 4,918,638
[45] Date of Patent: Apr. 17, 1990

[54] MULTIPLIER IN A GALOIS FIELD

[75] Inventors: Michihito Matsumoto, Osaka; Kazuhiro Murase, Hirakata, both of Japan

[73] Assignee: Matsushita Electric Industrial Co., Ltd., Osaka, Japan

[21] Appl. No.: 107,363

[22] Filed: Oct. 9, 1987

[30] Foreign Application Priority Data

Oct. 15, 1986 [JP]  Japan ............................ 61-244541
Oct. 21, 1986 [JP]  Japan ............................ 61-249910

[51] Int. Cl.⁴ .................................................. G06F 7/52
[52] U.S. Cl. .................................................. 364/746.1
[58] Field of Search ........................... 364/746.1, 754

[56] References Cited

U.S. PATENT DOCUMENTS

| | | | |
|---|---|---|---|
| 4,037,093 | 7/1977 | Gregg et al. | 364/746.1 |
| 4,251,875 | 2/1981 | Marver et al. | 364/746.1 |
| 4,473,887 | 9/1984 | Odaka | 364/746.1 |
| 4,587,627 | 5/1986 | Omura et al. | 364/754 |
| 4,697,248 | 9/1987 | Shirota | 364/754 |
| 4,745,568 | 5/1988 | Onyszchuk et al. | 364/754 |

FOREIGN PATENT DOCUMENTS 57-155667  9/1982  Japan.
60-144834  7/1985  Japan.

OTHER PUBLICATIONS

Laws, Jr. et al., "A Cellular—Array Multiplier For $GF(2^m)$", *IEEE Trans. on Computers*, Dec. 1971, pp. 1573-1578.

Wang et al., "YLSI Architectures for Computing Multiplications and Inverses in $GF(2^m)$", *IEEE Trans. on Computers*, vol. c—34, No. 8, Aug. 1985, pp. 709-717.

*Primary Examiner*—David H. Malzahn
*Attorney, Agent, or Firm*—Wenderoth, Lind & Ponack

[57] ABSTRACT

A circuit effects regular multiplicaton of two field elements in a Galois field $GF(2^m)$. Each of the field elements is expressed by an m-bit binary number. The two field elements are applied to a binary multiplier array which generates $(2m-1)$-bit partial products. The partial products are divided by a generator polynomial of the Galois field to produce final m-bit binary products.

5 Claims, 7 Drawing Sheets

FIG. 2

$$\begin{array}{ccccccc}
\alpha_6 & \alpha_5 & \alpha_4 & \alpha_3 & \alpha_2 & \alpha_1 & \alpha_0 \\
\downarrow & \downarrow & \downarrow & \downarrow & \downarrow & \downarrow & \downarrow \\
 & & & p_3 & p_2 & p_1 & p_0 \\
 & & \times & q_3 & q_2 & q_1 & q_0 \\
\hline
 & & & p_3 q_0 & p_2 q_0 & p_1 q_0 & p_0 q_0 \\
 & & p_3 q_1 & p_2 q_1 & p_1 q_1 & p_0 q_1 & \\
 & p_3 q_2 & p_2 q_2 & p_1 q_2 & p_0 q_2 & & \\
p_3 q_3 & p_2 q_3 & p_1 q_3 & p_0 q_3 & & & \\
\hline
r_6 & r_5 & r_4 & r_3 & r_2 & r_1 & r_0
\end{array}$$

FIG. 3

$$\begin{array}{ccccccc}
\alpha_6 & \alpha_5 & \alpha_4 & \alpha_3 & \alpha_2 & \alpha_1 & \alpha_0 \\
\downarrow & \downarrow & \downarrow & \downarrow & \downarrow & \downarrow & \downarrow \\
r_6 & r_5 & r_4 & r_3 & r_2 & r_1 & r_0 \\
r_6 & & & r_6 & r_6 & & \\
 & r_5 & & & r_5 & r_5 & \\
(+) & & r_4 & & & r_4 & r_4 \\
\hline
 & & & s_3 & s_2 & s_1 & s_0
\end{array}$$

| | $\alpha_6$ | $\alpha_5$ | $\alpha_4$ | $\alpha_3$ | $\alpha_2$ | $\alpha_1$ | $\alpha_0$ |
|---|---|---|---|---|---|---|---|
| | ↓ | ↓ | ↓ | ↓ | ↓ | ↓ | ↓ |
| | $r_6$ | $r_5$ | $r_4$ | $r_3$ | $r_2$ | $r_1$ | $r_0$ |
| ⊕ | $r_6$ | $k_3 r_6$ | $k_2 r_6$ | $k_1 r_6$ | $k_0 r_6$ | | |
| | | $r'_5$ | $r'_4$ | $r'_3$ | $r'_2$ | $r_1$ | $r_0$ |
| | ⊕ | $r'_5$ | $k_3 r'_5$ | $k_2 r'_5$ | $k_1 r'_5$ | $k_0 r'_5$ | |
| | | | $r''_4$ | $r''_3$ | $r''_2$ | $r''_1$ | $r_0$ |
| | | ⊕ | $r''_4$ | $k_3 r''_4$ | $k_2 r''_4$ | $k_1 r''_4$ | $k_0 r''_4$ |
| | | | | $s_3$ | $s_2$ | $s_1$ | $s_0$ |

MULTIPLIER IN A GALOIS FIELD

BACKGROUND OF THE INVENTION

1. Field of the Invention

The present invention relates to circuitry for effecting multiplication of two field elements in a Galois field.

2. Description of the Prior Art

Error correcting codes are used for correcting code errors which may arise from defects, damages, or dust on a recording medium when digital data is recorded on or reproduced from the recording medium. Particularly in the field of digital audio recording and playback, BCH coding and Reed-Solomon coding have been relied upon in recent years. A device for correcting such code errors requires a multiplier for multiplying field elements in a Galois field, expecially a high-speed, low-cost multiplier.

Various such multipliers have been proposed thus far. One example of such a multiplier which is thought highest in speed and lowest in cost is disclosed in U.S. Pat. No. 4,037,093. The disclosed multiplier has (m−1) modulo multipliers connected in cascade at a first stage to which one input F is connected. At a second stage, bits of the output of these multipliers and bits of input F are gated respectively by bits of the other input P, thereby producing (m×m) partial products, which are summed to produce a final product at a third stage.

The total number of such partial products is $m^2$, as described above. Therefore, as m gets larger, the number of the partial products increases vastly, with the result that the multiplier required is very large in size and high in cost, failing to operate at high speed.

SUMMARY OF THE INVENTION

An object of the present invention is to provide a high-speed, low-cost circuit for effecting multiplication of two field elements P, Q in a Galois field $GF(2^m)$.

The field elements are expressed by m binary bits, i.e., $p_i$, $q_i$ in $P=\Sigma p_i \cdot \alpha^i$, $Q=\Sigma q_i \cdot \alpha^i$ (i=0 through m−1). The two field elements P, Q are applied to a binary multiplier array which produces (2m−1)-bit partial products R. Assuming here that $R=\Sigma r_n \cdot \alpha^n$ (n=0 through 2m−2), $r_n$ for every n=u+v (u=0 through m−1≦n, v=0 through m−1≦n) becomes $r_n=\Sigma p_u \cdot q_v$.

A polynomial reducer is supplied with the above partial products R and effects division of R by the generator polynomial which defines the Galois field $GF(2^m)$ to generate m-bit final products $S=\Sigma s_i \cdot \alpha^i$ (i=0 through m−1). Here, $\alpha$ is a root of the generator polynomial $g(x)=x^m+\Sigma k_i \cdot x_i$ ($k_i$: coefficient).

Since the number of bits of the partial products which are sent from the binary multiplier array to the polynomial educer is 2m−1, the circuit size will not be greatly increased even if m becomes large. Therefore, a high-speed, low-cost multiplier can be realized.

BRIEF DESCRIPTION OF THE DRAWINGS

FIG. 2 is a diagram explaining operation by a binary multiplier array as shown in FIG. 1;

FIG. 3 is a diagram explaining one example of operation by a polynomial reducer as shown in FIG. 1;

DESCRIPTION OF THE PREFERRED EMBODIMENTS

Figure 1:
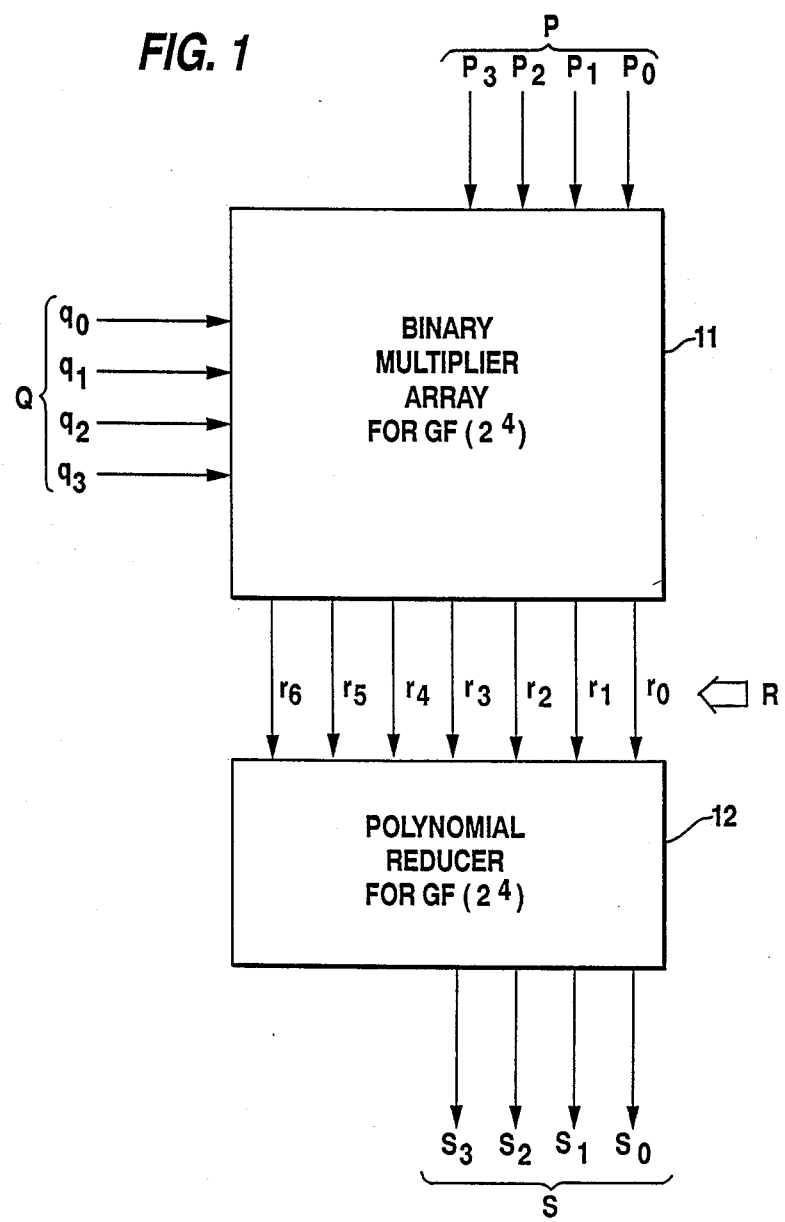
FIG. 1 is a block diagram of a four-bit multiplier in a Galois field $GF(2^4)$ according to the present invention.

The expression and operation of a Galois field $GF(2^m)$ will first be described. In the following description, multiplication in a Galois field is expressed by $\times$, addition by $+$, AND (logical product) operation by $\cdot$, and exclusive-OR (logical sum) operation by $\oplus$.

For example, a Galois field $GF(2^4)$ that can be derived from a generator polynomial $g(x)=x^4+x+1$ will be considered. The Galois field $GF(2^4)$ has 16 (=$2^4$) field elements $\{0, \alpha^0, \alpha^1, \alpha^2, \alpha^3, \ldots, \alpha^{14}\}$, where $\alpha$ is the root of $g(x)=0$ and is the same as what is expressed as z in U.S. Pat. No. 4,037,093. Since $\alpha$ is the root of $g(x)=0$, $\alpha^4+\alpha+1=0$, and hence $\alpha^4=\alpha+1$ by transposition according to the operation rules in a Galois field (subtraction is equivalent to addition for operations in a Galois field).

Likewise, all field elements in the Galois field $GF(2^4)$ can be expressed as a linear combination of $\alpha^0$, $\alpha^1$, $\alpha^2$, $\alpha^3$ as follows ($1=\alpha^{15}=\alpha^0$):

$$\alpha^5 = \alpha \times \alpha^4 = \alpha \times (\alpha \times 1) = \alpha^2 + \alpha$$
$$\alpha^6 = \alpha^2 \times \alpha^4 = \alpha^2 \times (\alpha + 1) = \alpha^3 + \alpha^2$$

$$\alpha^7 = \alpha^3 \times \alpha^4 = \alpha^3 \times (\alpha + 1)$$
$$= \alpha^4 + \alpha^3 = (\alpha + 1) + \alpha^3 = \alpha^3 + \alpha + 1$$

$$\alpha^8 = \alpha^4 \times \alpha^4 = (\alpha + 1) \times (\alpha + 1) = \alpha^2 + 1$$
$$\alpha^9 = \alpha \times \alpha^8 = \alpha(\alpha^2 + 1) = \alpha^3 + \alpha$$

The expression of the above linear combination with a 4-bit binary number is called a vector representation of a field element in a Galois field. For example, by allotting $\alpha^3$, $\alpha^2$, $\alpha^1$, $\alpha^0$ respectively to the four bits from upper to lower bits, the field elements can be represented as:

|  | $\alpha^3$ | $\alpha^2$ | $\alpha^1$ | $\alpha^0$ |
|---|---|---|---|---|
| 0 = | (0 | 0 | 0 | 0) |
| $\alpha^0$ = | (0 | 0 | 0 | 1) |
| $\alpha^1$ = | (0 | 0 | 1 | 0) |
| $\alpha^2$ = | (0 | 1 | 0 | 0) |
| $\alpha^3$ = | (1 | 0 | 0 | 0) |
| $\alpha^4$ = | (0 | 0 | 1 | 1) |
| $\alpha^5$ = | (0 | 1 | 1 | 0) |
| $\alpha^6$ = | (1 | 1 | 0 | 0) |
| $\alpha^7$ = | (1 | 0 | 1 | 1) |
| $\alpha^8$ = | (0 | 1 | 0 | 1) |
| $\alpha^9$ = | (1 | 0 | 1 | 0) |
| $\alpha^{10}$ = | (0 | 1 | 1 | 1) |
| $\alpha^{11}$ = | (1 | 1 | 1 | 0) |
| $\alpha^{12}$ = | (1 | 1 | 1 | 1) |
| $\alpha^{13}$ = | (1 | 0 | 0 | 1) |

-continued

| $\alpha^3$ | $\alpha^2$ | $\alpha^1$ | $\alpha^0$ |
|---|---|---|---|
| $\alpha^{14} = (0$ | $0$ | $0$ | $1)$ |

These are vector representations of all the field elements in the Galois field GF($2^4$).

Addition of vector-represented field elements in the Galois field is expressed by exclusive-OR operation of the field elements for each bit. For example, $$\begin{array}{r}(0001)\ \alpha^0 \\ +\ (1011)\ \alpha^7 \\ \hline (1010)\ \alpha^9\end{array}$$

Thus, $\alpha^0 + \alpha^7 = \alpha^9$.

FIG. 1 shows in block form a multiplier in the Galois field GF($2^4$) according to the present invention. A binary multiplier array 11 multiplies vector-represented first inputs P and vector-represented second inputs Q to issue partial products R expressed by "extended vector representation" which will be described later. A polynomial reducer 12 receives the partial products R and converts them by division by the generator polynomial into outputs S expressed by vector representation.

FIGS. 2 and 3 are diagrams illustrative of principles of multiplication effected in the multiplier shown in FIG. 1. FIG. 2 shows operation in the binary multiplier array 11. It is assumed that the vector representation of the first inputs P is ($p_3\ p_2\ p_1\ p_0$) and the vector representation of the second inputs Q is ($q_3\ q_2\ q_1\ q_0$). The first and second inputs P, Q can be expressed by polynomials of $\alpha$ as:

$$P = p_3 \cdot \alpha^3 + p_2 \cdot \alpha^2 + p_1 \cdot \alpha^1 + p_0 \cdot \alpha^0$$
$$Q = q_3 \cdot \alpha^3 + q_2 \cdot \alpha^2 + q_1 \cdot \alpha^1 + q_0 \cdot \alpha^0$$

Assuming that partial products R of P×Q are given by $R = r_6 \cdot \alpha^6 + r_5 \cdot \alpha^5 + r_4 \cdot \alpha^4 + r_3 \cdot \alpha^3 + r_2 \cdot \alpha^2 + r_1 \cdot \alpha^1 + r_0 \cdot \alpha^0$, $r_0$ through $r_6$ become:

$$\begin{aligned}r_0 &= p_0 \cdot q_0 \\ r_1 &= p_1 \cdot q_0 \oplus p_0 \cdot q_1 \\ r_2 &= p_2 \cdot q_0 \oplus p_1 \cdot q_1 \oplus p_0 \cdot q_2 \\ r_3 &= p_3 \cdot q_0 \oplus p_2 \cdot q_1 \oplus p_1 \cdot q_2 \oplus p_0 \cdot q_3 \\ r_4 &= p_3 \cdot q_1 \oplus p_2 \cdot q_2 \oplus p_1 \cdot q_3 \\ r_5 &= p_3 \cdot q_2 \oplus p_2 \cdot q_3 \\ r_6 &= p_3 \cdot q_3\end{aligned}$$

Since the partial products R have not been subjected to division by the generator polynomial, they are represented by a linear combination of the terms of $\alpha^0$ through $\alpha^6$, and thus called "extended vector representation".

FIG. 3 represents operation in the polynomial reducer 12. It is assumed that the generator polynomial $g(x) = x^4 + x + 1$ and the vector representation of the outputs S when the extended vector representation of the inputs R is ($r_6\ r_5\ r_4\ r_3\ r_2\ r_1\ r_0$) is ($s_3\ s_2\ s_1\ s_0$). The extended vector representation includes the terms of $\alpha^6$, $\alpha^5$, $\alpha^4$ in addition to those of the vector representation. Therefore, in order to transform the field elements in the Galois field expressed in the extended vector representation to the vector representation, it is necessary to develop the terms of $\alpha^6$, $\alpha^5$, $\alpha^4$ to the terms of $\alpha^3$ through $\alpha^0$. For developing the term of $\alpha^6$, i.e., $r_6$, for example, $\alpha^4 + \alpha + 1 = 0$ since $\alpha$ is the root of the generator polynomial $g(x) = 0$, and hense $r_6 \cdot (\alpha^6 + \alpha^3 + \alpha^2) = 0$. The extended vector representation thereof results in ($r_6\ 0\ 0\ r_6\ r_6\ 0\ 0$). This is added to R. Since the original value remains unchanged even if 0 is added in the addition operation of field elements in the Galois field, $r_6$, i.e., the term of $\alpha^6$, is eliminated and developed to the terms of $\alpha^3$ and $\alpha^2$. Likewise, $r_5$ and $r_4$ are also eliminated and developed. FIG. 3 shows the above process in detail. As shown in FIG. 3, the outputs S = ($s_3\ s_2\ s_1\ s_0$) are given by:

$$\begin{aligned}s_3 &= r_3 \oplus r_6 \\ s_2 &= r_2 \oplus r_6 \oplus r_5 \\ s_1 &= r_1 \oplus r_5 \oplus r_4 \\ s_0 &= r_0 \oplus r_4\end{aligned}$$

Figures 4, 6:
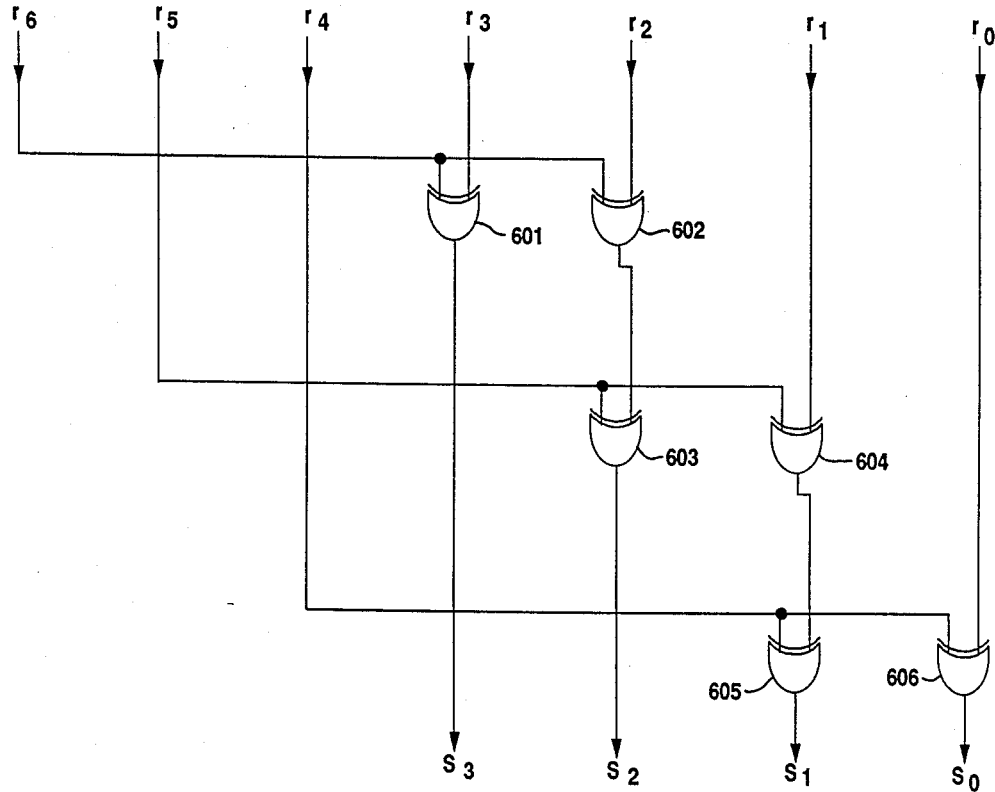
FIG. 4 is a diagram explaining another example of operation by a polynomial reducer as shown in FIG. 1.
FIG. 6 is a circuit diagram showing an example of a polynomial reducer for carrying out the operation shown in FIG. 3.

FIG. 4 shows operation in the polynomial reducer 12 at the time the generator polynomial is generalized as $g(x) = x^4 + k_3 \cdot x^3 + k_2 \cdot x^2 + k_1 \cdot x + k_0$, where $k_3$ through $k_0$ are 1 or 0. By combining these values, an arbitrary quartic generator polynomial $g(x)$ can be expressed. Stated otherwise, FIG. 4 shows expansion of the operation of FIG. 3 to an arbitrary generator polynomial. In order to eliminate the term of $\alpha^6$, $r_6 \cdot (\alpha^6 + k_3 \cdot \alpha^5 + k_2 \cdot \alpha^4 + k_1 \cdot \alpha^3 + k_0 \cdot \alpha^2)$ is added to R. Since this value is 0, the value of R remains unchanged after the addition. Assuming that the sum is given by $r_5' \cdot \alpha^5 + r_4' \cdot \alpha^4 + r_3' \cdot \alpha^3 + r_2' \cdot \alpha^2 + r_1' \cdot \alpha^1 + r_0'$, $r_5'$ through $r_0'$ are expressed as:

$$\begin{aligned}r_5' &= r_5 \oplus r_3 \cdot r_6 \\ r_4' &= r_4 \oplus r_2 \cdot r_6 \\ r_3' &= r_3 \oplus r_1 \cdot r_6 \\ r_2' &= r_2 \oplus r_0 \cdot r_6 \\ r_1' &= r_1 \\ r_0' &= r_0\end{aligned}$$

The term of $\alpha^6$ is now developed to the terms of $\alpha^5$ through $\alpha^2$ by the above operation. For a Galois Field GF($2^m$), generally, the term of $\alpha^i$ can be developed to the terms of $\alpha^{i-1}$ through $\alpha^{i-m}$ by carrying out the above operation once. Then, in order to eliminate the term of $\alpha^5$, $r_5 \cdot (\alpha^5 + k_3 \cdot \alpha^4 + k_2 \cdot \alpha^3 + k_1 \cdot \alpha^2 + k_0 \cdot \alpha)$ is added to R. In this manner, the terms of up to $\alpha^4$ are eliminated until finally the outputs S = ($s_3\ s_2\ s_1\ s_0$) expressed solely by the terms of $\alpha^3$ through $\alpha^0$ can be obtained as shown in FIG. 4. As described above, by arranging the polynomial reducer 12 so that it will carry out the operation shown in FIG. 4, the multiplier in the Galois field according to the embodiment of FIG. 1 can cope with any desired generator polynomial.

Figure 5:
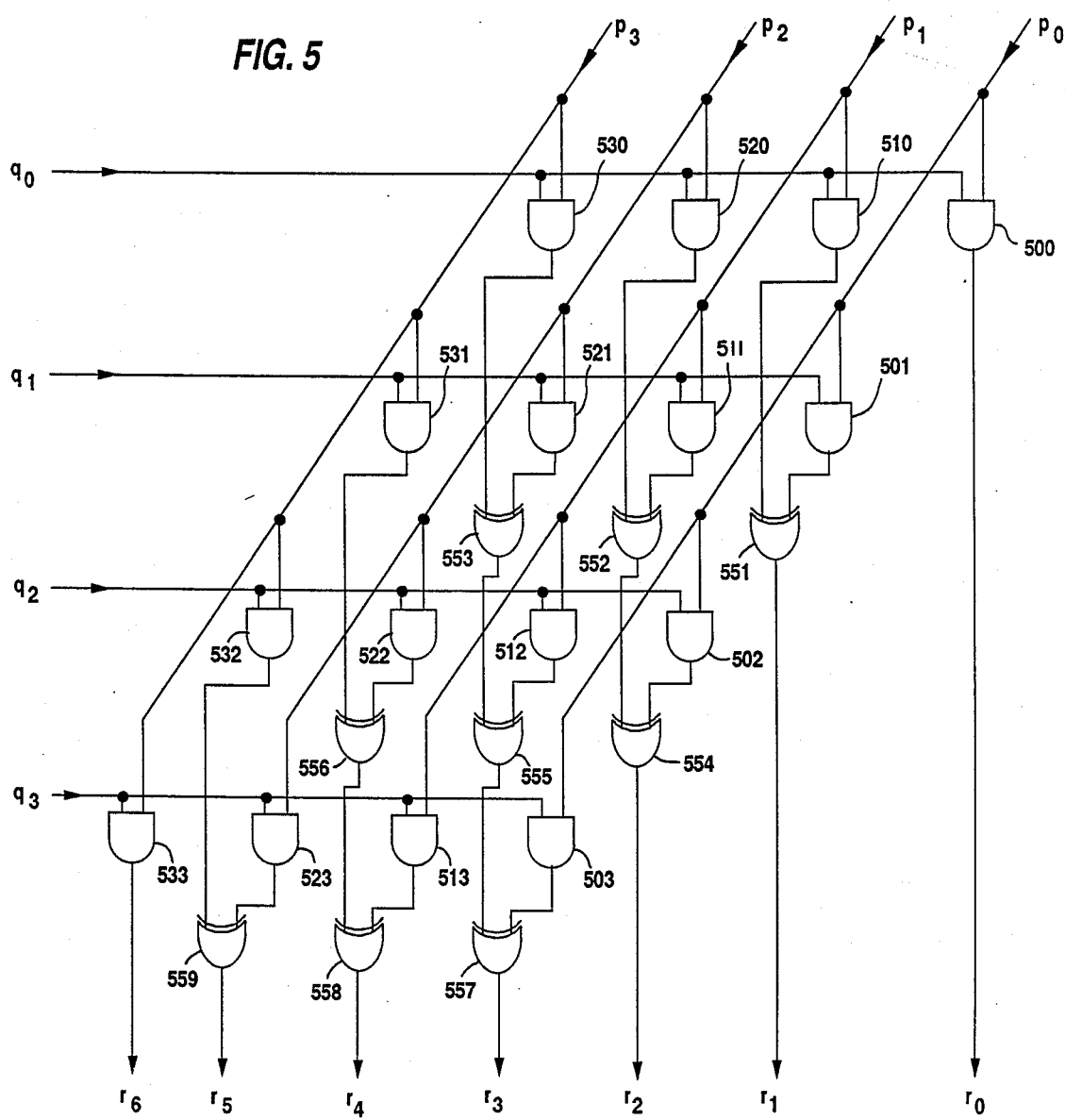
FIG. 5 is a circuit diagram showing an example of a binary multiplier array for carrying out the binary operation shown in FIG. 2.

FIG. 5 shows by way of example a specific circuit arrangement for the binary multiplier array 11 shown in FIG. 1. This circuit arrangement is constructed to effect the operation shown in FIG. 2. An AND gate 500 effects the AND operation of $p_0 \cdot q_0$ in FIG. 2. Other AND gates 501, 502, 503, 510, 511, 512, 513, 520, 521, 522, 523, 530, 531, 532, 533 also effect respective AND operations in FIG. 2. EX-OR (Exclusive-OR) gates 551 through 559 perform the addition in FIG. 2.

FIG. 6 shows by way of example a specific circuit arrangement for the polynomial reducer 12 shown in FIG. 1, the circuit arrangement being constructed to effect the operation of FIG. 3. An EX-OR gate 601 effects the exclusive-OR operation of $r_3 \oplus r_6$ in FIG. 3. EX-OR gates 602 through 606 also effect respective exclusive-OR operations in FIG. 3, i.e., addition of vector-represented field elements in the Galois field.

Figure 7:
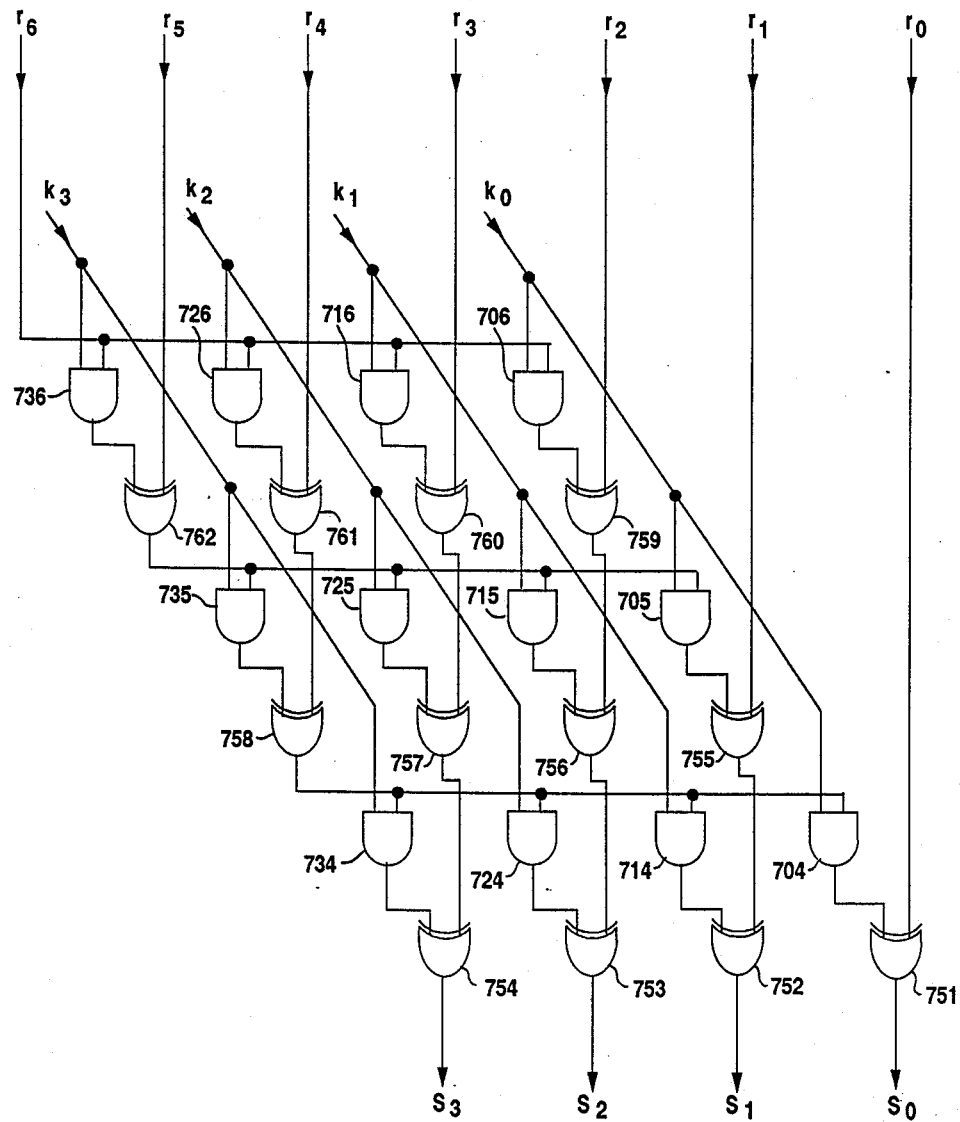
FIG. 7 is a circuit diagram showing an example of a polynomial reducer for carrying out the operation shown in FIG. 4.

FIG. 7 illustrates another specific circuit arrangement for the polynomial reducer 12 shown in FIG. 1, the circuit arrangement being constructed to carry out the operation of FIG. 4. An AND gate 736 effects the AND operation of $k_3 \cdot r_6$ in FIG. 4, and other AND gates 735, 734, 726, 725, 724, 716, 715, 714, 706, 705, 704 also effect respective AND operations in FIG. 4. One input of each of the AND gates is controlled by coefficient $k_i$ of the generator polynomial. EX-OR gates 751 through 762 perform respective bit additions in FIG. 4.

Figure 8:
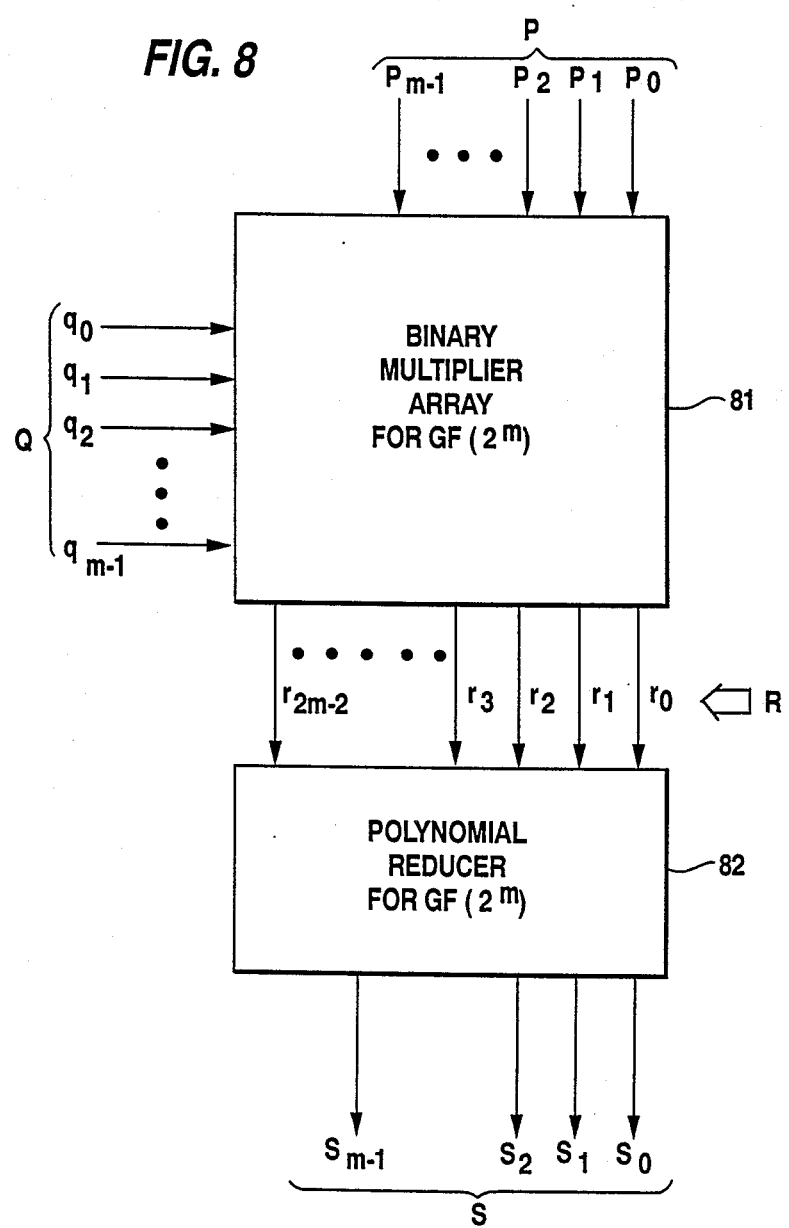
FIG. 8 is a block diagram of an m-bit multiplier in a Galois field $GF(2^m)$ according to the present invention.

FIG. 8 is a block diagram of a multiplier in a Galois field according to an embodiment of the present invention which is applied to a general Galois field GF($2^m$). The multiplier shown in FIG. 8 is the same as that of FIG. 1 except that the generator polynomial is $g(x) = x^m + \Sigma k_i \cdot x^i$ (i=0 through m−1) and the vector representation is of m bits and the extended vector representation is of (2m−1) bits. That is, $$P = \Sigma p_i \cdot \alpha^i, Q = \Sigma q_i \cdot \alpha^i \ (i = 0 \text{ through } m - 1),$$

$$R = \Sigma r_n \cdot \alpha^n (n = 0 \text{ through } 2m - 2), \text{ and}$$

$$S = \Sigma s_i \cdot \alpha^i (i = 0 \text{ through } m - 1)$$

where $n = u + v$ ($u = 0$ through $m - 1 \leq n$, $v = 0$ through $m - 1 \leq n$), and $r_n = \Sigma p_u \cdot q_v$.

The fact that the vector representation is of (2m−1) bits can easily be understood by expanding 4×4 in FIG. 2 to m×m.

Figure 9:
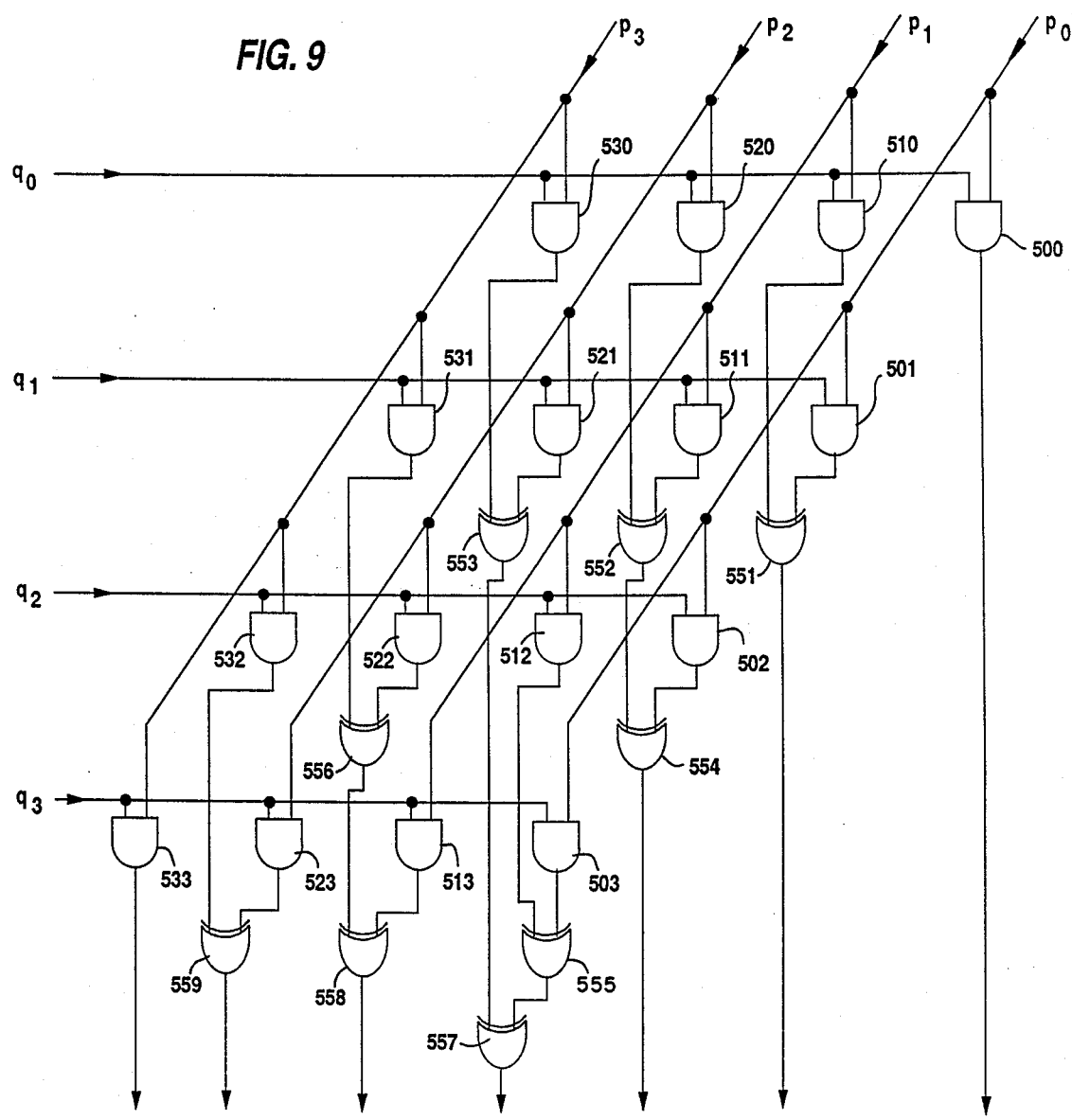
FIG. 9 is a circuit diagram showing another example of a binary multiplier array for carrying out the operation shown in FIG. 2.

It is generally known that the sum of a bit addition using an EX-OR gate remains the same even if the sequence of the bit addition is changed. Therefore, the sequence of bit addition using EX-OR gates in the present invention is not limited to the arrangement shown in each of FIGS. 5 through 7. FIG. 9 shows one example of a binary multiplier array which is provided by reconstructing the binary multiplier array of FIG. 5 based on the above idea. It is to be noted that the EX-OR gates 553, 555, 557 in the binary multiplier array shown in FIG. 9 are connected in different sequence from that in FIG. 5.

What is claimed is:

1. An apparatus for carrying out multiplication of field elements $P = \Sigma p_i \cdot \alpha^i$, $Q = \Sigma q_i \cdot \alpha^i$ (i=0 through m−1) in a Galois field GF($2^m$) whose generator polynomial is $g(x) = x^m + \Sigma k_i \cdot x^i$ (i=0 through m−1, ki=binary coefficient) comprising:

a binary multiplier array supplied with the field elements P, Q for generating partial products $R = \Sigma r_n \cdot \alpha^n$ (n=0 through 2m−2) where $r_n = \Sigma p_u \cdot q_v$ for all n=u+v (u=0 through m−1≦n and v=0 through m−1≦); and a polynomial reducer supplied with the partial products R for generating final products $S = \Sigma s_i \cdot \alpha^i$ (i=0 through m−1, Si=binary component of S) through division of the partial products R by the generator polynomial.

2. An apparatus according to claim 1, wherein said binary multiplier array comprises AND gates each for effecting an AND operation of $p_i \cdot q_i$ and exclusive-OR gates for effecting bit addition of outputs from said AND gates.

3. An apparatus according to claim 1, wherein said polynomial reducer comprises a plurality of exclusive-OR gates for reducing terms of $\alpha^{2m-2}$ through $\alpha^m$ of the partial products R to terms of $\alpha^{m-1}$ through $\alpha^0$ thereof and effecting bit addition of the terms which have been reduced and the terms of $\alpha^{m-1}$ through $\alpha^0$ of the partial products R.

4. An apparatus according to claim 1, wherein said polynomial reducer comprises a plurality of exclusive-OR gates arranged for reducing each term $\alpha^n$ of the partial products R to terms of $\alpha^{n-1}$ through $\alpha^{n-m}$ thereof in repeated cycles from n=2m−2 to m, thereby reducing terms of $\alpha^{2m-2}$ through $\alpha^m$ of the partial products R to terms of $\alpha^{m-1}$ through $\alpha^0$ thereof.

5. An apparatus according to claim 4, wherein said polynomial reducer further includes AND gates connected so that one input of each of the AND gates is controlled by a coefficient $k_i$ of the generator polynomial.

* * * * *